(12) United States Patent
Yamaguchi

(10) Patent No.: US 6,169,455 B1
(45) Date of Patent: Jan. 2, 2001

(54) POWER AMPLIFYING CIRCUIT AND AUTOMATIC POWER CONTROL METHOD

(75) Inventor: Yuu Yamaguchi, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/323,401

(22) Filed: Jun. 1, 1999

(30) Foreign Application Priority Data

Jun. 2, 1998 (JP) ................................................. 10-169273

(51) Int. Cl.$^7$ ..................................................... H03G 3/30
(52) U.S. Cl. ........................................... 330/279; 330/285
(58) Field of Search .................................. 330/278, 279, 330/281, 285, 289, 129, 136

(56) References Cited

U.S. PATENT DOCUMENTS

| | | | | |
|---|---|---|---|---|
| 4,547,746 | * | 10/1985 | Erickson et al. ................. | 330/279 X |
| 5,138,274 | * | 8/1992 | Nakanishi et al. ............... | 330/285 X |
| 5,291,147 | * | 3/1994 | Muurinen .............................. | 330/136 |
| 5,371,477 | * | 12/1994 | Ikeda et al. ....................... | 330/285 X |
| 5,532,646 | * | 7/1996 | Aihara .................................. | 330/279 |

FOREIGN PATENT DOCUMENTS 3-9522   1/1991   (JP) .

8-51317   2/1996   (JP) .

* cited by examiner

Primary Examiner—Steven J. Mottola
(74) Attorney, Agent, or Firm—Young & Thompson

(57) ABSTRACT

For the purpose of enhancing power efficiency, according to the invention featuring efficiency control to maximize power efficiency, an arithmetic circuit calculates the input power from a detected voltage and a detected amperage, and also calculates the power efficiency of an amplifier from the input power and output power levels. The calculated efficiency value is outputted to a comparator and stored into a memory element. The comparator compares the currently inputted efficiency value and the efficiency value stored into the memory element in the preceding round. If the current efficiency value is higher than that of one round before, the gate voltage control circuit is controlled in the same direction as that of the control of the preceding round. If the current efficiency value is lower than that of one round before, the gate voltage control circuit is controlled in the direction reverse to that of the control of the preceding round. If the current efficiency value is identical with that of one round before, the gate voltage control circuit is controlled so as to keep the gate voltage at its level in the preceding round.

16 Claims, 15 Drawing Sheets

| T = −30°C | | | T = 0°C | | |
| --- | --- | --- | --- | --- | --- |
| f = 880MHz | | | f = 880MHz | | |
| Pin(dBm) | Vd | Vg | Pin(dBm) | Vd | Vg |
| −10 | 5.0 | 1.20 | −10 | 5.1 | 1.21 |
| −8 | 4.9 | 1.19 | −8 | 5.0 | 1.20 |
| −6 | 4.8 | 1.18 | −6 | 4.9 | 1.19 |
| −4 | 4.6 | 1.17 | −4 | 4.7 | 1.18 |
| −2 | 4.4 | 1.16 | −2 | 4.5 | 1.17 |
| 0 | 4.2 | 1.14 | 0 | 4.3 | 1.15 |
| 2 | 4.0 | 1.12 | 2 | 4.1 | 1.13 |
| 4 | 3.9 | 1.10 | 4 | 4.0 | 1.11 |
| 6 | 3.8 | 1.08 | 6 | 3.9 | 1.09 |
| 8 | 3.7 | 1.05 | 8 | 3.8 | 1.06 |
| 10 | 3.6 | 1.02 | 10 | 3.7 | 1.03 |
| f = 890MHz | | | f = 890MHz | | |
| Pin(dBm) | Vd | Vg | Pin(dBm) | Vd | Vg |
| −10 | 5.01 | 1.20 | −10 | 5.11 | 1.21 |
| −8 | 4.91 | 1.19 | −8 | 5.01 | 1.20 |
| −6 | 4.81 | 1.18 | −6 | 4.91 | 1.19 |
| −4 | 4.61 | 1.17 | −4 | 4.71 | 1.18 |
| −2 | 4.41 | 1.16 | −2 | 4.51 | 1.17 |
| 0 | 4.22 | 1.14 | 0 | 4.32 | 1.15 |
| 2 | 4.02 | 1.12 | 2 | 4.12 | 1.13 |
| 4 | 3.92 | 1.10 | 4 | 4.02 | 1.11 |
| 6 | 3.82 | 1.08 | 6 | 3.92 | 1.09 |
| 8 | 3.73 | 1.06 | 8 | 3.83 | 1.07 |
| 10 | 3.63 | 1.03 | 10 | 3.73 | 1.04 |

POWER AMPLIFYING CIRCUIT AND AUTOMATIC POWER CONTROL METHOD

BACKGROUND OF THE INVENTION

1. Field of the Invention

The present invention relates to a power amplifying circuit having an automatic power control function for use in radio transmitters and the like.

2. Description of the Related Art

In view of the requirements to reduce power consumption and efficiently utilize frequency resources, it is desirable for transmission power to be set to a sufficient and yet not excessively high level. A portable radio apparatus, for instance, is controlled to raise its transmission power when the level of signals received from it at the base station is not high enough. Or if the level of signals received from a portable radio apparatus is unnecessarily high at the base station, control is effected to reduce the transmission power of that portable unit. Therefore, radio transmitters are provided with an automatic power control (APC) function to match the transmission power of each to an individually set level.

FIG. 15 is a block diagram illustrating a power amplifying circuit with an APC function according to the prior art, described in the Gazette of the Japanese Utility Model Laid-open No. Hei 3-9522. In the diagram, a preamplifier 41 and an amplifier 42 consisting of field effect transistors (FETs) amplify input signals inputted to an input terminal 1. Whereas output signals from the amplifier 42 are outputted to an output terminal 2, the level of output power is detected by a detecting circuit 4. The output power level detected by the detecting circuit 4 and a set output power level inputted to a set input terminal 10 are inputted to an APC circuit 9. The drain voltage of the preamplifier 41 and the amplifier 42 is determined to make the output power level identical with the set output power level, and this voltage is applied to the drain terminals of the preamplifier 41 and the amplifier 42.

The set output power level and the drain voltage determined by the APC circuit 9 are inputted to an idle current control circuit 43, which determines the idle current during the absence of radio signals so as to maximize the power efficiency on the basis of the set output power level and drain voltage at the time, and applies a voltage matching the idle current to the gates of the preamplifier 41 and the amplifier 42.

In this way, the idle current control circuit 43 controls the gate bias of the preamplifier 41 and the amplifier 42 so as to enhance the power efficiency.

The power amplifying circuit referred to above, however, controls the idle current according to the set output power level of each unit, but does not actually measure or calculate the efficiency and performs control on that basis. Thus, with respect to efficiency, it is an open loop control arrangement to determine the gate bias according to the control output of the APC function. Thus, the gate bias value is determined indiscriminately according to the set output power level of each. However, even if the set output power level is the same, the gate bias value to give the maximum efficiency may vary with the input power level, temperature and frequency among other factors. Therefore the above-cited power amplifying circuit involves the problem that the gate bias value to provide the maximum efficiency may deviate from the optimal value.

Furthermore, the performance characteristics of an amplifiers (including the input/output characteristic, temperature characteristic, frequency characteristic, output power versus drain voltage characteristic, efficiency versus gate current characteristic and static characteristic) generally tend to fluctuate. In order to keep the power efficiency of power amplifying circuits high against fluctuations in characteristics, it is necessary to measure the characteristics of amplifiers in each power amplifying circuit, and adjust the input/output characteristic of the idle current control circuit 43 in each individual power amplifying circuit. These procedures are detrimental to efficient mass production, and at the same time entail additional costs.

In view of these problems, an object of the present invention is to provide a power amplifying circuit having an APC function which can provide a high power efficiency all the time even if such conditions of operation as the output power level, input power level, temperature and frequency vary, and can automatically keep the power efficiency high even if amplifier characteristics are not constant.

Incidentally, other power amplifying circuits having an APC function intended for power efficiency enhancement by controlling the gate bias include one described in the Gazette of the Japanese Patent Laid-open No. Hei 8-51317, but this power amplifying circuit, too, merely sets the gate bias matching the output of the APC circuit, and also determines the gate bias value indiscriminately according to the set output power level. However, even if the output level is the same, the gate bias value to give the maximum efficiency is not necessarily the same if the input power level, temperature and frequency among other factors vary.

SUMMARY OF THE INVENTION

A power amplifying circuit according to the present invention is provided with an APC loop for causing the output power level to comply with the set output power level and an efficiency control loop for detecting the power efficiency (output power/power consumption) and controlling the bias value of an amplifier arranged in the power amplifying circuit so as to maximize the power efficiency.

The efficiency control loop may have a configuration comprising an arithmetic means for calculating the power efficiency of the power amplifying circuit by introducing the input current, the input voltage and the output power level of the power amplifying circuit, and a bias control means for controlling the bias value of the amplifier on the basis of an efficiency value outputted from the arithmetic means.

The arithmetic means, intended to calculate the efficiency value at prescribed intervals of time, and the bias control means may have a configuration wherein the efficiency value currently outputted from the arithmetic means and the efficiency value outputted from the arithmetic means at the preceding control timing are compared, and the bias value of the amplifier is altered if the two efficiency values are not identical.

Alternatively, the bias control means may have a configuration wherein, if the efficiency value currently outputted from the arithmetic means is greater than the preceding efficiency value, the bias value is varied in the same direction in which it was varied at the preceding control timing, or if the efficiency value currently outputted from the arithmetic means is smaller than the preceding efficiency value, the bias value is varied in the direction reverse to that in which it was varied at the preceding control timing.

Here the amplifier is a FET, and the configuration may be such that the APC loop controls the drain bias value of the FET and the efficiency control loop controls the gate bias value of the FET.

Preferably, the response of the APC loop should be quicker than that of the efficiency control loop.

The efficiency control loop may have a configuration wherein control is effected when the output power level of the amplifier is identical with the set output power level.

Further, the power amplifying circuit may have a configuration wherein a presetting means stores control setpoints to give the maximum efficiency at different set output power levels and, when the set output power level changes, outputs a control setpoint matching the changed level to the amplifier.

The power amplifying circuit may have a configuration wherein an input level detecting means for detecting the input power level of the amplifier is provided, and the presetting means has control setpoints to give the maximum efficiency at different input power levels and, when the input power level changes, outputs a control setpoint matching the changed level to the amplifier.

Alternatively, the power amplifying circuit may have a configuration wherein a temperature detecting means for detecting the temperature is provided, and the presetting means stores bias value to give the maximum efficiency at different temperatures and, when the temperature changes, outputs a control setpoint matching the changed temperature to the amplifier.

The presetting means may as well have a configuration to store control setpoints to give the maximum efficiency at different frequencies and, when the frequency of signals inputted to the amplifier changes, to output a control setpoint matching the changed frequency to the amplifier.

Furthermore, a power amplifying circuit having any of the foregoing configurations may amplify constant-envelopemodulated signals.

An automatic power control method according to the invention is so composed as to detect the output power level of a power amplifying circuit, to control an amplifier provided in the power amplifying circuit so as to make the detected output power level identical with a set output power level, to measure the power efficiency of the power amplifying circuit, and to control the bias value of the amplifier so as to maximize the power efficiency.

The automatic power control method may as well have a composition wherein the power efficiency of an amplifier is measured intermittently, each measured efficiency value is compared with the efficiency value measured at the preceding measurement timing and, if the two efficiency values are not identical, the bias value of the amplifier is varied in the direction of enhancing the power efficiency.

The composition may as well be such that, if the currently measured efficiency value is greater than the preceding efficiency value, the bias value is varied in the same direction in which it was varied at the preceding measurement timing, or if the currently measured efficiency value is smaller than the preceding efficiency value, the bias value is varied in the direction reverse to that in which it was varied at the preceding measurement timing.

Furthermore, by an automatic power control method of any of the foregoing compositions, constant envelope-modulated signals may be the objects of power control.

BRIEF DESCRIPTION OF THE DRAWINGS

FIG. 12 is a diagram for explaining one example of the conversion table.

DETAILED DESCRIPTION OF THE PREFERRED EMBODIMENTS

Preferred embodiments of the present invention will be described in detail below with reference to drawings.

Embodiment 1

Figure 1:
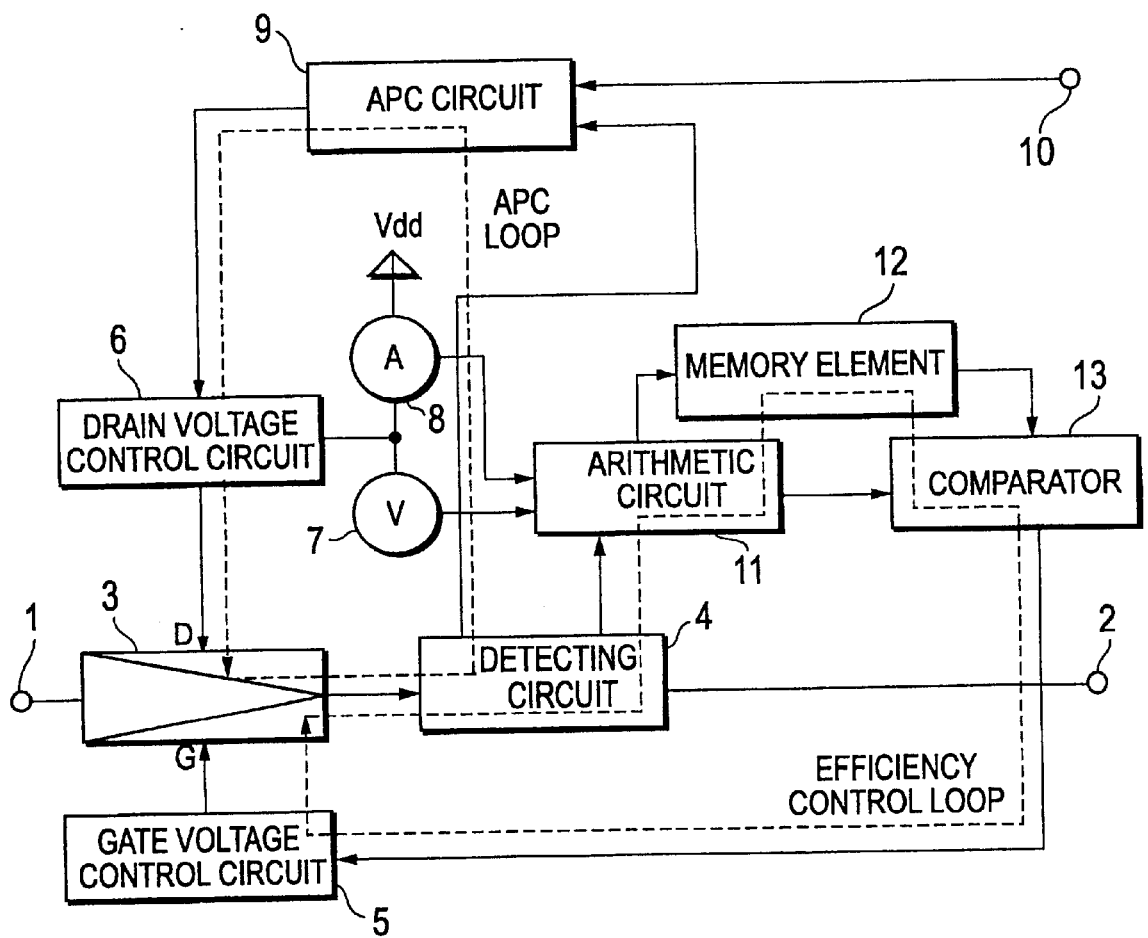
FIG. 1 is a block diagram illustrating a power amplifying circuit which is a first embodiment of the present invention.

FIG. 1 is a block diagram illustrating a power amplifying circuit which is a first embodiment of the present invention. In the diagram, an amplifier 3 consisting of a MOSFET amplifies input signals inputted to an input terminal 1. Whereas output signals from the amplifier 3 are outputted from an output terminal 2, the output power level is detected by a detecting circuit 4. To an APC circuit 9 are inputted the output power level detected by the detecting circuit 4 and a set output power level inputted to a set input terminal 10. The drain voltage of the amplifier 3 is determined so as to make the output power level identical with the set output power level, and a control command value is outputted to a drain voltage control circuit 6, which applies a voltage matching the control command value to the drain terminal of the amplifier 3.

Figure 2:
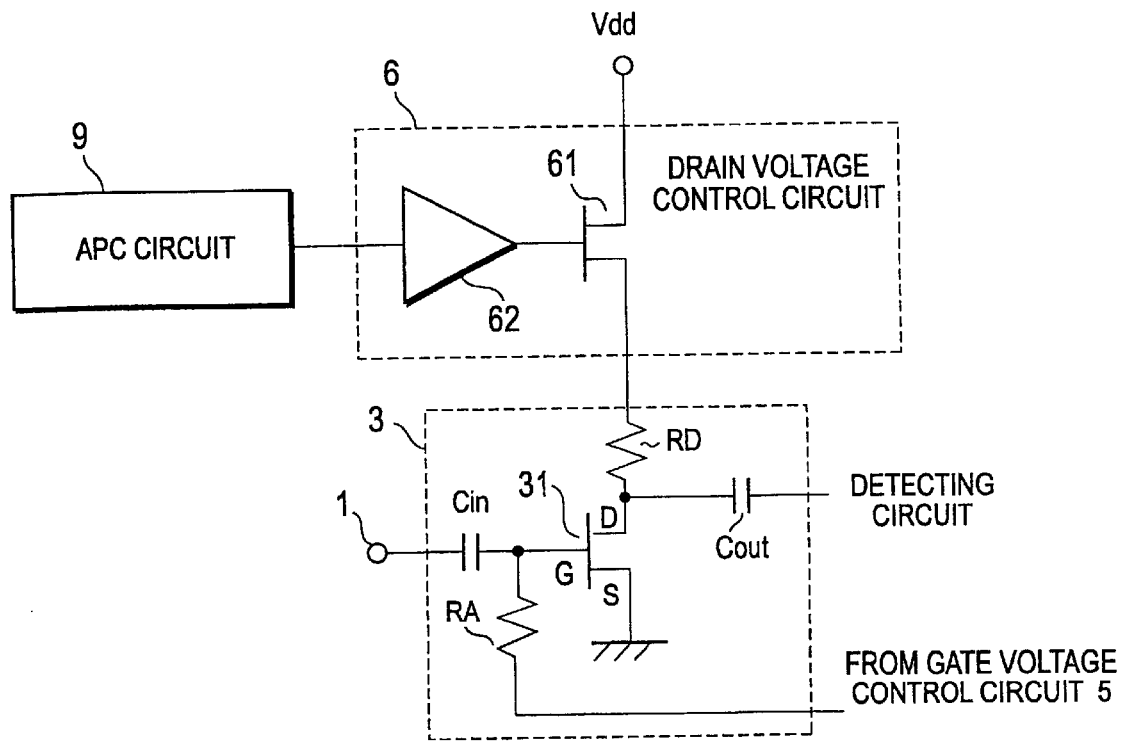
FIG. 2 is a circuit diagram illustrating one example of the configuration of the amplifier and the drain voltage control circuit.

FIG. 2 is a circuit diagram illustrating one example of the configuration of the amplifier 3 and the drain voltage control circuit 6. In the example shown in FIG. 2, the amplifier 3 uses a FET 31 which introduces input signals to the gate via a capacitor Cin. To the gate of the FET 31 is applied via a resistor RA a gate bias voltage which is controlled by a gate voltage control circuit 5. To the drain of the FET 31 is applied via a resistor RD a drain bias voltage which is controlled by the drain voltage control circuit 6. The output of the FET 31 is taken out via the resistor RD and a capacitor Cout. In the drain voltage control circuit 6, a source voltage Vdd controlled by an N-ch MOSFET 61 is applied to the drain of the amplifier 3. To the gate of the MOSFET 61 is applied via an operational amplifier 62 a voltage matching the control command value determined by the APC circuit 9.

With reference to FIG. 1, between the drain voltage control circuit 6 and the power source are provided an ammeter 8 and a voltmeter 7. To an arithmetic circuit 11 are inputted the amperage from the ammeter 8, the voltage from the voltmeter 7 and the output power level detected by the detecting circuit 4. On their basis, the arithmetic circuit 11 calculates the power efficiency, and outputs the calculated efficiency value to a memory element 12 and a comparator 13.

The comparator 13 compares the efficiency value of a round before written in the memory element 12 and the current efficiency value delivered from the arithmetic circuit 11, and determines the gate voltage on the basis of the result of comparison so as to maximize the power efficiency, and outputs the determined value to the gate voltage control circuit 5 as the control command value. The gate voltage control circuit 5 applies to the gate terminal of the amplifier 3 a voltage matching the control command value. A "round" in this context means an interval of intermittent control over the gate voltage of the amplifier 3.

Although a change in the gate voltage of the amplifier 3 as controlled by the gate voltage control circuit 5 results in a change in the output voltage level of the amplifier 3, the output power level is kept at the set output power level because the drain voltage of the amplifier 3 is controlled by the APC circuit 9.

In this embodiment, the arithmetic means is realized by the arithmetic circuit 11, and the bias control means, by the comparator 13 and the gate voltage control circuit 5. The APC circuit 9, the arithmetic circuit 11, the memory element 12 and the comparator 13 can be realized, for instance, by a single microprocessor. In that case, processing by the APC loop and that by the efficiency control loop are realized by software.

Figure 3:
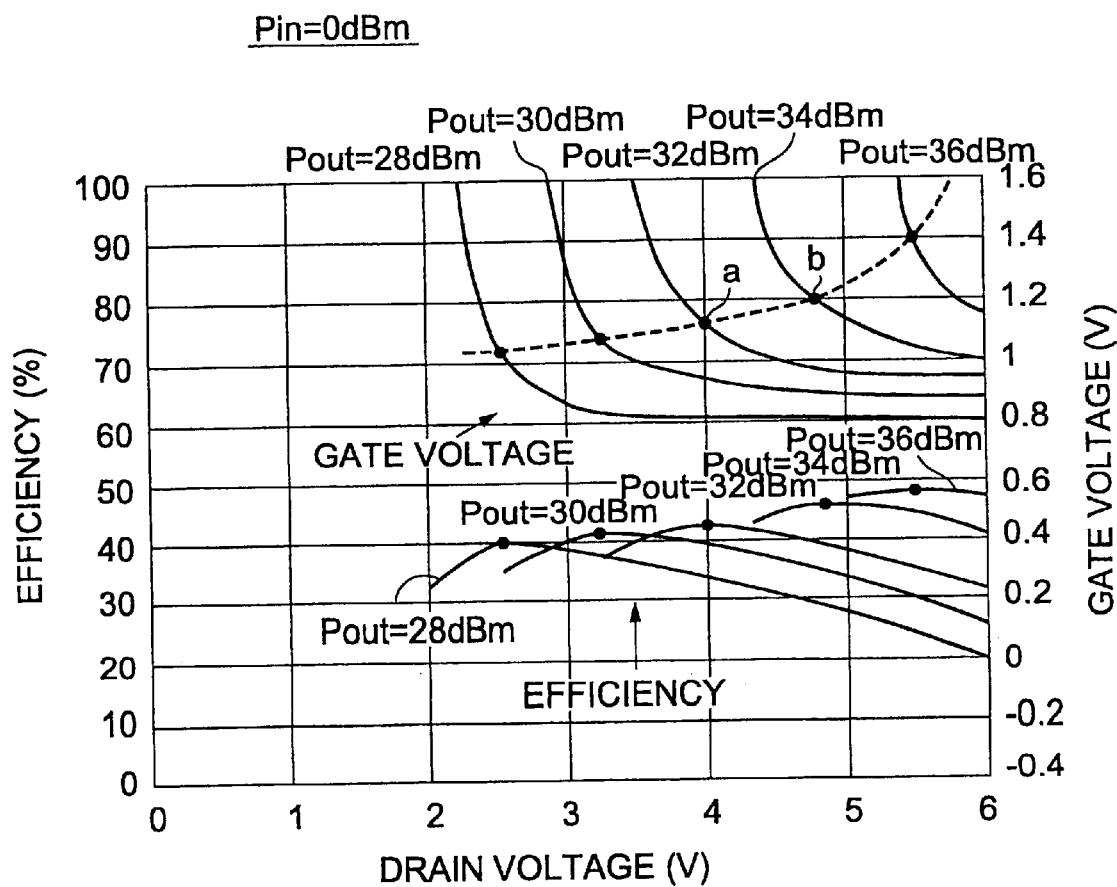
FIG. 3 is a diagram for explaining the dependence of the power efficiency and the gate voltage on the drain voltage when the input power level, temperature and frequency are kept constant, with the output power level of the amplifier consisting of a MOSFET being used as the parameter.

Next, referring to FIG. 3, the control by the efficiency control loop to maximize the power efficiency will be described more specifically. FIG. 3 is a diagram for explaining the dependence of the power efficiency and the gate voltage on the drain voltage when the input power level, temperature and frequency are kept constant, with the output power level of the amplifier 3 consisting of a MOSFET being used as the parameter.

It is seen from FIG. 3 that once the output power level, input power level, temperature and frequency are determined, there is only one combination of drain voltage and gate voltage that gives the maximum efficiency. Thus, as the output power level is varied when the input power level, temperature and frequency are constant, the maximum efficiency is achieved when the drain voltage and gate voltage are on the broken line in FIG. 3.

For instance, when the output power level is 32 dBm, the combination of drain voltage and gate voltage that gives the maximum efficiency is that of the two voltages at point a. Or when the output power level is 34 dBm, the combination of drain voltage and gate voltage that gives the maximum efficiency is that of the two voltages at point b.

The reason why there is only one combination of drain voltage and gate voltage that gives the maximum efficiency at a given output power level will be explained below.

If the drain voltage is reduced from its level where the maximum efficiency is achieved, the drain current will have to be increased by raising the gate voltage to achieve the prescribed output power level. As a result, the operating class of the amplifier 3 will come closer to "A" and its power efficiency will drop. Or if the drain voltage is raised above its level where the maximum efficiency is achieved, the saturation output power of the amplifier 3 will also rise, resulting in an enlarged difference between the saturation output power and the prescribed output power level. Thus, an increase output back-off will invite a drop in efficiency. In other words, a tradeoff between the operating class and the output back-off determines only one combination of drain voltage and gate voltage that gives the maximum efficiency.

Next will be described the operation of this embodiment.

Figure 4:
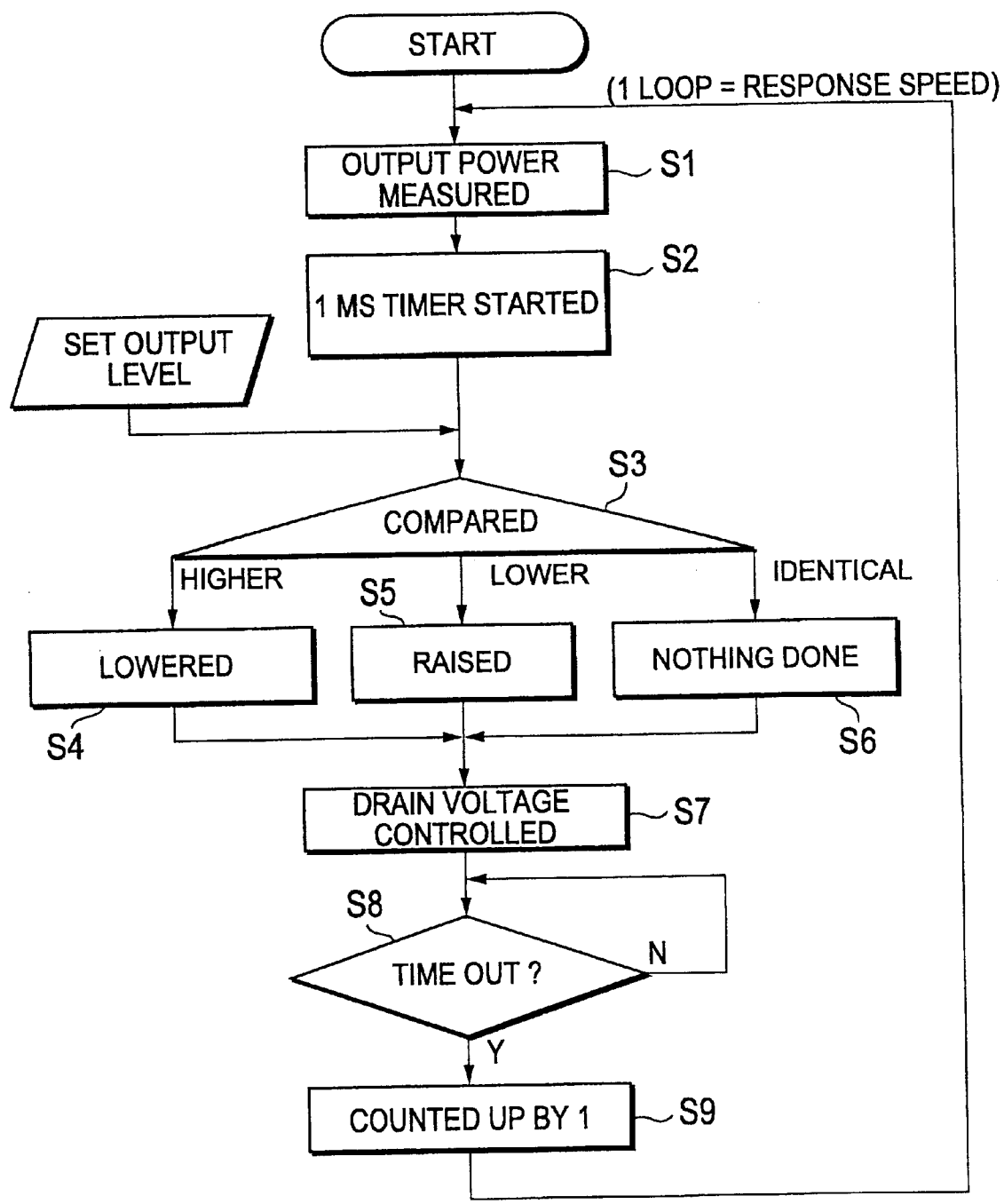
FIG. 4 is a flow chart showing the operation of the APC loop.

As stated above, the power amplifying circuit of this embodiment includes an APC loop and an efficiency control loop. FIG. 4 is a flow chart showing the operation of the APC loop. The APC loop, as indicated by broken lines in FIG. 1, comprises the amplifier 3, the detecting circuit 4, the APC circuit 9 and the drain voltage control circuit 6. In this example, one round of the APC loop is accomplished in 1 ms. The APC circuit 9 effects control over the drain voltage control circuit 6 every millisecond.

In the APC loop, the detecting circuit 4 obtains the output power of the amplifier 3 on the basis of the detection voltage (step S1). For instance, the detecting circuit 4, having a table of detection voltage versus output power, obtains the output power by searching the table on the basis of the detection voltage, and actuates a 1 ms timer (step S2).

The APC circuit 9, to which the set output power level inputted to the set input terminal 10 and the output power level detected by the detecting circuit 4 are inputted, compares the two levels (step S3). If the detected output power level is higher than the set output power level, the APC circuit 9 will control the drain voltage control circuit 6 so as to reduce the drain voltage (step S4). Or if the detected output power level is lower than the set output power level, the APC circuit 9 will control the drain voltage control circuit 6 so as to raise the drain voltage (step S5). If the detected output power level and the set output power level are found identical, the APC circuit 9 will maintain the control command value given the drain voltage control circuit 6 (step S6).

The drain voltage control circuit 6 raises, reduces or maintains the gate voltage of the amplifier 3 according to the control command value from the APC circuit 9 (step S7). After that, when the timer has completed counting 1 ms (step S8), a counter is counted up by +1 (step S9). This counter is used for determining the control timing of the efficiency control loop.

Figure 5:
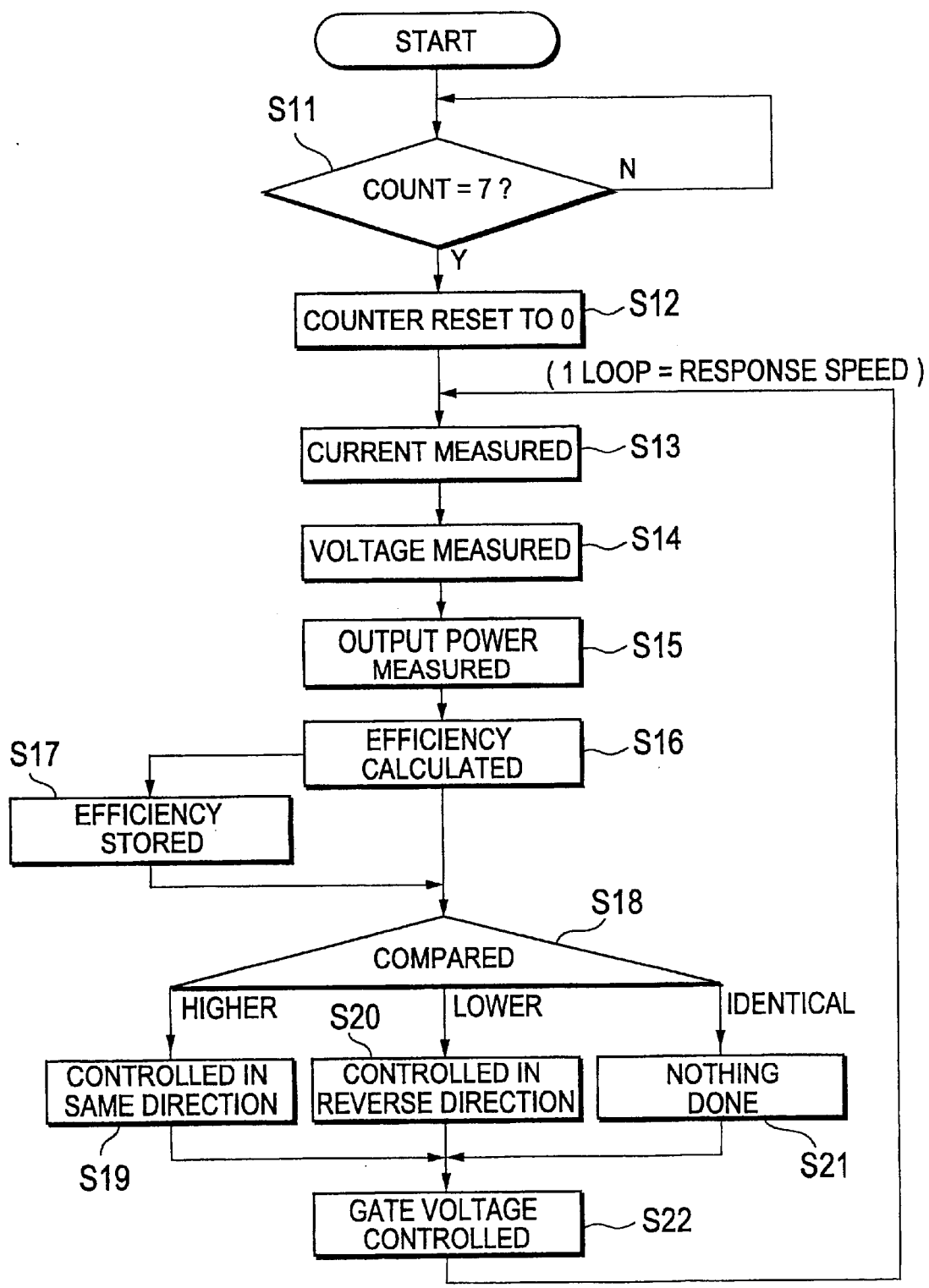
FIG. 5 is a flow chart showing the operation of the efficiency control loop.

FIG. 5 is a flow chart showing the operation of the efficiency control loop. The efficiency control loop, as indicated by broken lines in FIG. 1, comprises the amplifier 3, the arithmetic circuit 11, the memory element 12, the comparator 13 and the gate voltage control circuit 5. The efficiency control loop operates in parallel with the APC loop. In this example, the response speed of the efficiency control loop is set to be 1/7 of that of the APC loop. Therefore, when the count of the aforementioned counter comes to 7, the arithmetic circuit 11 calculates the power efficiency, and the comparator 13 controls the gate voltage control circuit 5.

The arithmetic circuit 11 waits until the counter counts 7 (step S22), and initializes the counter when its count comes to 7 (step 12). The counter is counted up under the control of the APC loop as stated above. To the arithmetic circuit 11 are inputted the amperage detected by the ammeter 8, the voltage detected by the voltmeter 7, and the output power level detected by the detecting circuit 4 (steps S13 to S15). It calculates the input power from the detected voltage and amperage, and also calculates the power efficiency of the amplifier 3 from the input power and output power level (step S16). The arithmetic circuit 11 outputs the calculated efficiency value to the comparator 13 and stores it into the memory element 12 (step S17). Incidentally, the power efficiency here also reflects power consumption by the drain voltage control circuit 6 and the gate voltage control circuit 5.

The comparator 13 compares the inputted efficiency value and the efficiency value stored into the memory element 12 one round before (step S18). One round of the efficiency control loop in this example is 1×7=7 ms. If the current efficiency value is higher than the efficiency value of the round before, the comparator 13 controls the gate voltage control circuit 5 in the same direction in which it effected control in the preceding round (step S19). The same direction is the direction of raising the gate voltage if the control was to raise the gate voltage in the preceding round, or the direction of reducing the gate voltage if the control was to reduce the gate voltage in the preceding round. If the current efficiency value is lower than the efficiency value of the round before, the comparator 13 controls the gate voltage control circuit 5 in the direction reverse to that in which it effected control in the preceding round (step S20). If the current efficiency value is equal to the efficiency value of the round before, the comparator 13 controls the gate voltage control circuit 5 to maintain the gate voltage of the round before (step S21).

The gate voltage control circuit 5 raises, reduces or maintains the gate voltage of the amplifier 3 according to the control command value from the comparator 13 (step S22). A change in the gate voltage of the amplifier 3 under the control of the gate voltage control circuit 5, the output voltage of the amplifier 3 would vary, but the APC loop immediate controls the drain voltage of the amplifier 3, so that the output power level is kept at the set output power level. Therefore, the output power level of the amplifier 3 is maintained at the set output power level, and the gate bias value of the amplifier 3 converges on the bias point where the maximum efficiency is achieved.

Here, if the response speed of the efficiency control loop was higher than that of the APC loop, the efficiency control loop might reduce the gate voltage to its lower limit before the output power level is controlled, making it impossible for the output power level to be controlled. It is for this reason that the response of the efficiency control loop is set to be slower than that of the APC loop.

In this example, the configuration wherein one round of processing by the APC loop (the sampling and arithmetic processing of the output power, and drain voltage control) is executed for every seven rounds of processing by the efficiency control loop (i.e. the sampling and arithmetic processing of the input amperage, input voltage and output power, and gate voltage control), the response speed of the APC loop is set to be seven times as high as that of the efficiency control loop. Whereas the response speed of the efficiency control loop is set to be about 5 ms when the data transfer speed is 5.6 kbps for instance, this can be readily realized by appropriately changing the setpoint of the afore-mentioned timer. The ratio between the response speed of the APC loop and that of the efficiency control loop can also be readily changed by varying the criterion count of the counter (7 in this instance).

Incidentally, although the processing by the APC loop and that by the efficiency control loop are synchronized, they need not be synchronized if the response speed of the APC loop is higher than that of the efficiency control loop.

Figure 6:
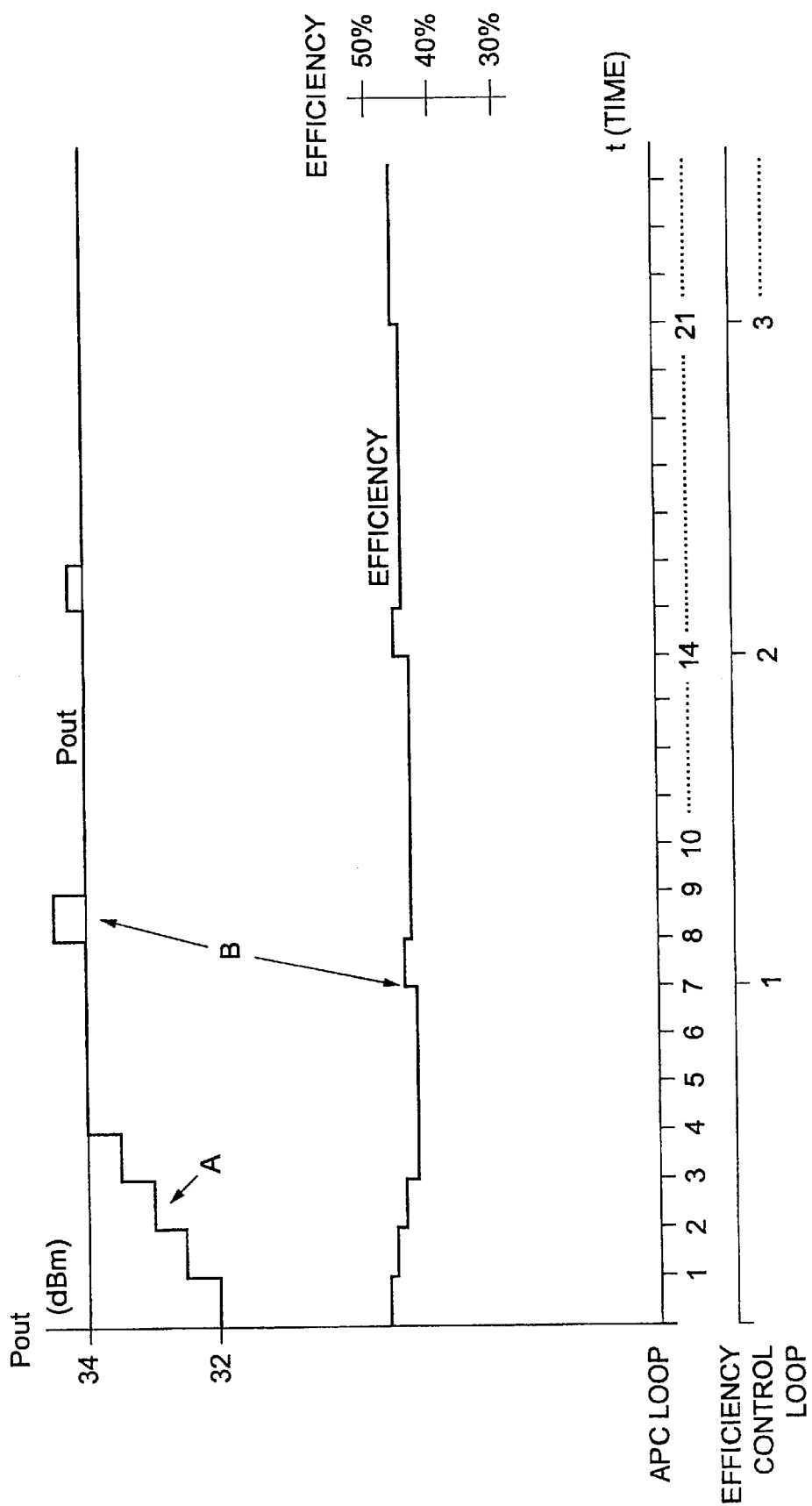
FIG. 6 is a timing chart showing how a bias point which gives the maximum efficiency is converged upon.

FIG. 6 is a timing chart showing how a bias point which gives the maximum efficiency is converged upon by above-described control. In the example shown in FIG. 6, the set output power value changes from 32 dBm to 34 dBm, and the response speed of the APC loop is seven times as high as that of the efficiency control loop.

As illustrated in FIG. 6, when the set output power level is altered from 32 dBm to 34 dBm, first the APC loop brings the output power level of the amplifier 3 toward 34 dBm (see A in FIG. 6). The efficiency drops along with that. When the efficiency control loop begins to work, the efficiency rises, but this entails a deviation of the output power level of the amplifier 3 from 34 dBm (see B in FIG. 6). However, the APC loop immediately brings back the output power level to 34 dBm. After that, efficiency enhancement by the efficiency control loop and output power control by the APC loop are repeated to settle the output of the amplifier 3 at 34 dBm, where the maximum efficiency is achieved.

Figure 7:
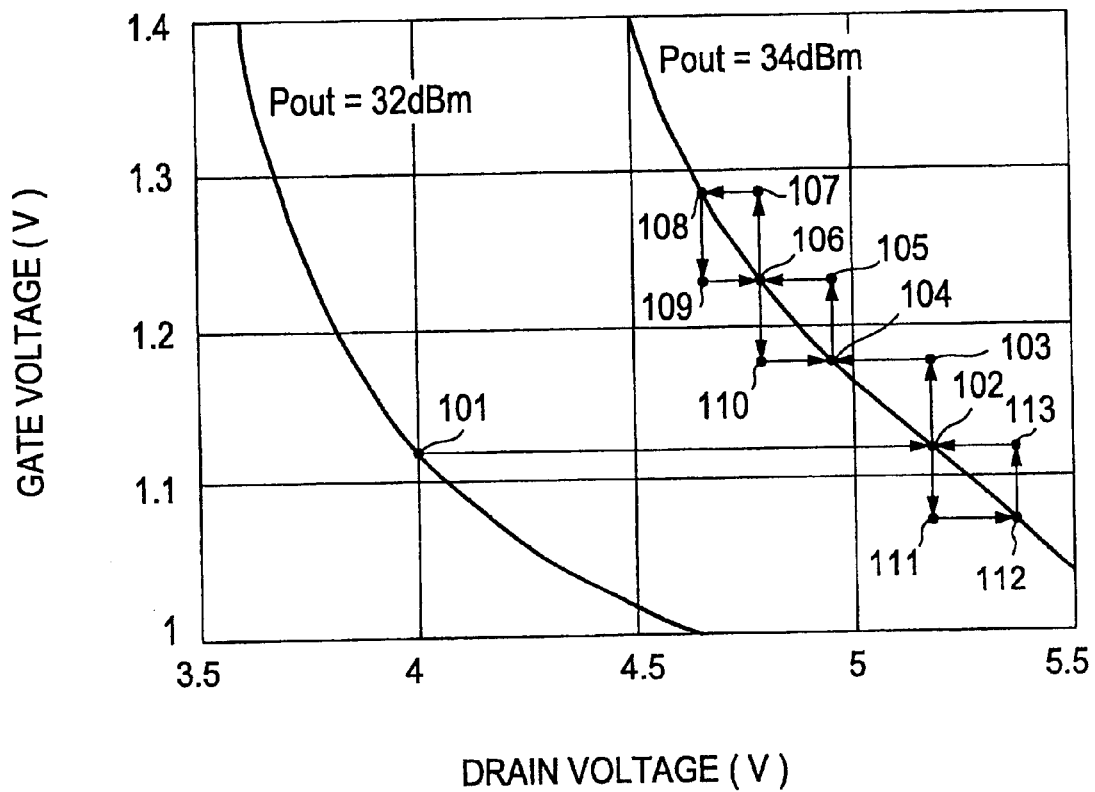
FIG. 7 is a diagram for explaining the operation that takes place when the set output voltage level has varied from 32 dBm to 34 dBm.

Next will be described, with reference to FIG. 7, specific control actions which take place when the set output level is altered. FIG. 7 is a diagram for explaining the operation that takes place when the set output voltage level has varied from 32 dBm to 34 dBm. In this illustration, the control steps of the gate voltage are shown bigger than the steps in practical use. Further to facilitate description, the comparator 13 is supposed to be able to detected even infinitesimal differences, and the response speed of the APC loop, to be sufficiently higher than that of the efficiency control loop.

As shown in FIG. 7, when the output power level is 32 dBm, the bias point is set at point 101, where the maximum efficiency is achieved. Further, it is supposed that the bias point which gives the maximum efficiency when the output power level is 34 dBm is point 106. As the set output power level varies to 34 dBm, the drain voltage rises under the control of the APC loop, and the bias point shifts to point 102.

The arithmetic circuit 11 in the efficiency control loop calculates the efficiency value under the bias condition at point 102, and outputs the efficiency value to the memory element 12 and the comparator 13. The comparator 13 compares the efficiency value under the bias condition at point 102 and the efficiency value of one round before, stored in the memory element 12. As the current efficiency value here differs from the efficiency value of one round before, the comparator 13 instructs the gate voltage control circuit 5 to alter the gate voltage. Accordingly, the bias point shifts to point 103 or point 111.

For instance, if the current efficiency value is lower than that of one round before and control was effected at the timing of one round before to raise the gate voltage, the comparator 13 instructs the gate voltage control circuit 5 to effect control in the reverse direction, i.e. to lower the gate voltage. Then the bias point shifts to point 111. If the current efficiency value is lower than that of one round before and control was effected at the timing of one round before to lower the gate voltage, the comparator 13 instructs the gate voltage control circuit 5 to effect control in the reverse direction, i.e. to raise the gate voltage. Then the bias point shifts to point 103. In short, the bias point shifts to either point 103 or point 111 depending on the then prevailing conditions (the input power level, output power level, temperature, frequency, characteristic of the amplifier 3, and variation of the output power level).

To add, if control was effected at the timing of one round before to keep the gate voltage as it was, the comparator 13 effects control either to raise or to lower the gate voltage.

If the bias point shifts to point 103 (the control is in the direction of raising the gate voltage), the bias point immediately shifts to point 104 under the control of the APC loop. Then the arithmetic circuit 11 in the efficiency control loop calculates the efficiency value under the bias condition at point 104, and outputs the efficiency value to the memory element 12 and the comparator 13. As the current efficiency value under the bias condition at point 104 is higher than the efficiency value of one round before, i.e. that under the bias condition at point 102, the comparator 13 instructs the gate voltage control circuit 5 to control the gate voltage in the same direction as before. Since the control was in the direction of raising the gate voltage in the preceding round, the gate voltage control circuit 5 raises the gate voltage. Accordingly, the bias point shifts to point 105. Then the bias point immediately shifts to point 106 under the control of the APC loop.

The arithmetic circuit 11 in the efficiency control loop then calculates the efficiency value under the bias condition at point 106, and outputs the efficiency value to the memory element 12 and the comparator 13. As the current efficiency value under the bias condition at point 106 is higher than the efficiency value of one round before, i.e. that under the bias condition at point 104, the comparator 13 instructs the gate voltage control circuit 5 to control the gate voltage in the same direction as before. Since the control was in the direction of raising the gate voltage in the preceding round, the gate voltage control circuit 5 raises the gate voltage. Accordingly, the bias point shifts to point 107, but the bias point immediately shifts to point 108 under the control of the APC loop.

As the efficiency value under the bias condition as point 108 is lower than the efficiency value under the bias condition at point 106, the gate voltage is controlled this time in the reverse direction, and therefore the bias point shifts to point 109. However, the bias point immediately shifts to point 106 under the control of the APC loop. As the current efficiency value under the bias condition at point 106 is higher than the efficiency value under the bias condition at point 108, the gate voltage is controlled in the same direction, and the bias point shifts to point 110, but the bias point immediately shifts to point 104 under the control of the APC loop.

Thus the bias point repeats shifting to points 104, 105, 106, 107, 108, 109, 106, 110 and 104, and substantially converges on point 106, which is the bias point giving the maximum efficiency.

If the bias point shifts to point 110 (the control is in the direction of lowering the gate voltage) when the set output power level has been altered to 34 dBm, the bias point immediately shifts to point 112 under the control of the APC loop. As the current efficiency value under the bias condition at point 112 is lower than the efficiency value under the bias condition at point 102, the gate voltage is controlled in the direction reverse to the preceding round (in the direction of raising the gate voltage in this instance), and the bias point shifts to point 113, but the bias point immediately shifts to point 102 under the control of the APC loop.

Since the current efficiency value under the bias condition at point 102 is higher than the efficiency value under the bias condition at point 112, the gate voltage is controlled in the same direction as in the preceding round, and the bias point shifts to point 103, but the bias point immediately shifts to point 104 under the control of the APC loop.

Thereafter, as in the above-described instance, the bias point repeats shifting to points 104, 105, 106, 107, 108, 109, 106, 110 and 104, and substantially converges on the bias point giving the maximum efficiency.

In this illustration, to make it easier to understand how convergence takes place, the control steps of the gate voltage are shown bigger than the steps in practical use, and the comparator 13 is supposed to be able to detected even infinitesimal differences, resulting in the failure of bias points to converge upon one point. However, in reality, by appropriately setting the control steps of the gate voltage and the criterion of judgment by the comparator 13, bias points do converge on one point.

If the control steps of the gate voltage are enlarged and the criterion of judgment by the comparator 13 is made less strict, the efficiency will greatly vary in a step, but the comparator 13 may be unable to detect the difference and judge that the efficiency has not varied. If it does, the convergence may deviate from the bias point which should provide the maximum efficiency. Or if the control steps of the gate voltage are too small and if the criterion of judgment by the comparator 13 is relatively loose, the efficiency will hardly vary in a step, and the comparator 13 may be unable to detect the difference and judge that convergence has taken place before the bias point which should provide the maximum efficiency is reached. If the control steps of the gate voltage are small and the criterion of judgment by the comparator 13 is strict, the efficiency variation in a step will be small, but the comparator 13 can detect even a small difference with the result that the bias point keeps on shifting around the point which would provide the maximum efficiency.

Therefore, in practical use, the size of control steps of the gate voltage and the resolution of the comparator 13 are set so as to make it impossible to detect any difference in efficiency between point 106 and the adjoining points 104 and 108. For instance, the control step size is set to be a few millivolts and the resolution of efficiency by the comparator 13, about ±0.05%. Then, when the bias point shifts to point 106 and the arithmetic circuit 11 has calculated the efficiency value under the bias condition of point 106, the comparator 13 detects the identity between the efficiency value under the bias condition of point 106 and the efficiency value under the bias condition of point 104. Therefore, the comparator 13 effects control to maintain the gate voltage as it is. As a result, bias points converge on point 106 which gives the maximum efficiency.

Although the foregoing description referred to a case in which the set output power level varies, if the input power level, temperature or frequency varies or the characteristic of the amplifier 3 is different, the comparator 13 in the efficiency control loop detects any drop in power efficiency, and automatically instructs the gate voltage control circuit 5 so as to set the gate voltage which gives the maximum efficiency. Thus, even if those conditions vary, the efficiency control loop will automatically function to cause bias points to converge the point where the maximum efficiency is achieved.

Figure 8:
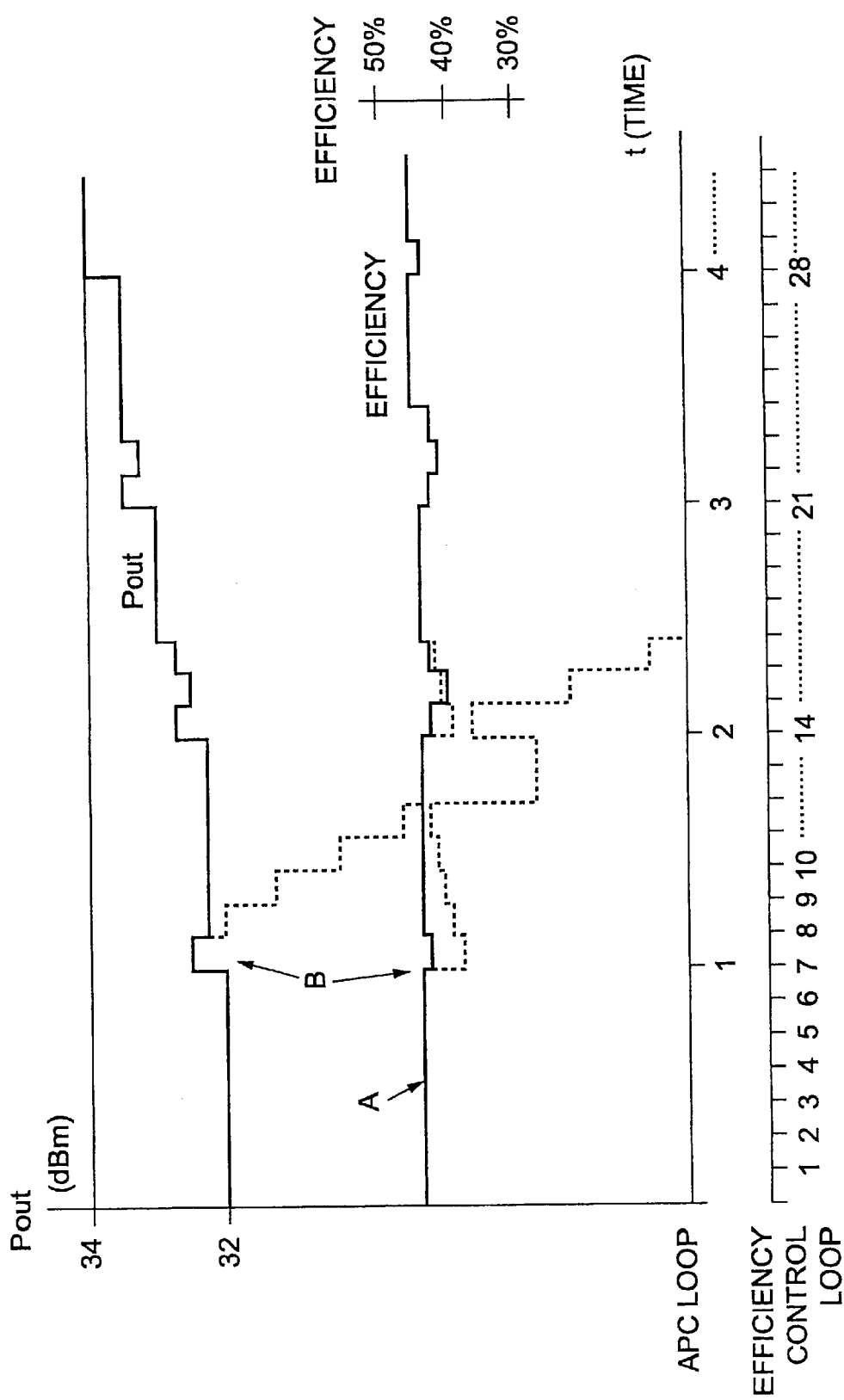
FIG. 8 is a timing chart showing an example for comparison of the operation of the efficiency control loop.

FIG. 8 is a timing chart showing an example for comparison of the operation of the efficiency control loop. In the example shown in FIG. 8, the response speed of the efficiency control loop is higher than that of the APC loop. While the set output power value is altered from 32 dBm to 34 dBm, as the APC loop does not work at first, the efficiency control loop maintains the maximum efficiency at 32 dBm (see A in FIG. 8). When the APC loop begins to work, the output power level of the amplifier 3 rises and, along with that, the efficiency drops (see B in FIG. 8).

Whereas the efficiency is enhanced by the efficiency control loop after that, if the efficiency control loop works in the wrong direction of control, the gate voltage is reduced to its lower limit by the efficiency control loop before the APC loop controls the output power level, and the APC loop control becomes unable to control the output power level (see the broken lines in FIG. 8). Thus there is the fear that no convergence takes place if the response speed of the APC loop is lower than that of the efficiency control loop.

Embodiment 2

Figure 9:
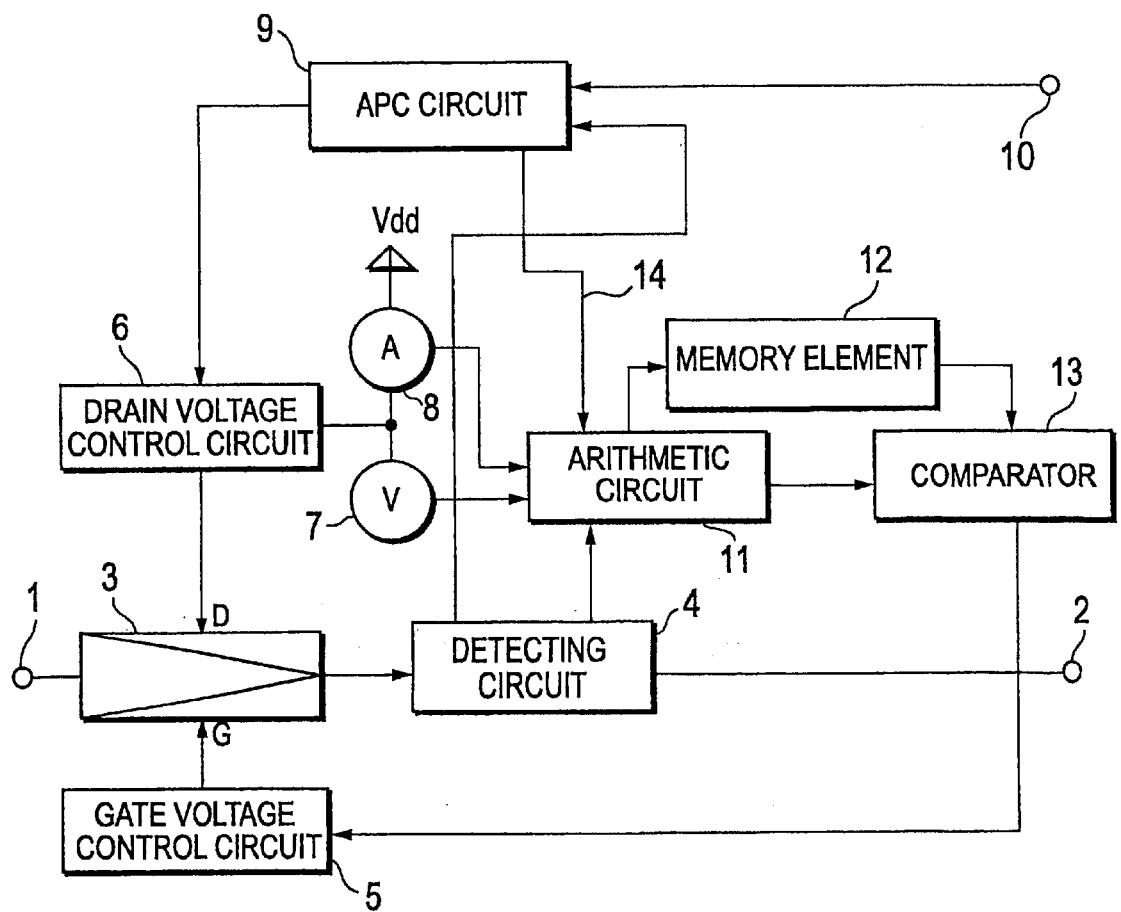
FIG. 9 is a block diagram illustrating a power amplifying circuit which is a second embodiment of the present invention.

FIG. 9 is a block diagram illustrating a power amplifying circuit which is a second embodiment of the present invention. As shown in FIG. 9, in this embodiment, the APC circuit 9 and the arithmetic circuit 11 are connected by a setting level identity signal line 14. While other aspects of the configuration are the same as the corresponding ones of the first embodiment, the arithmetic circuit 11 in this embodiment either operates or interrupts operation depending on the signal emerging on the setting level identity signal line 14.

Next will be described the operation of this embodiment.

The APC loop performs control similar to that in the first embodiment, and makes the output power level of the amplifier 3 identical with the set output power level. Then the APC circuit 9 outputs an ON signal via the setting level identity signal line 14 if the output power level is identical with the set output power level as controlled by the APC loop. If the output power level is not identical with the set output power level, the APC circuit 9 outputs an OFF signal.

The arithmetic circuit 11 calculates the power efficiency from the drain amperage, drain voltage and power output level of the amplifier 3 only when an ON signal is on the setting level identify signal line 14, and outputs the calculated efficiency value to the memory element 12 and the comparator 13. The comparator 13 and the gate voltage control circuit 5, operating in the same manner as in the first embodiment, provides a gate voltage that gives the maximum efficiency to the gate terminal of the amplifier 3.

When an OFF signal is on the setting level identify signal line 14, the arithmetic circuit 11 does not calculate the power efficiency. As no updated efficiency value is inputted to the comparator 13, the comparator 13 continues to control the gate voltage control circuit 5 so as to keep the gate voltage of the amplifier 3 as it is. Thus, when an OFF signal is on the setting level identify signal line 14, no control by the efficiency control loop takes place.

As described above, in this embodiment, the efficiency control loop operates only when the APC loop is converging on the set output power level. Therefore, it has the advantage of permitting the response speed of the APC loop and that of the efficiency control loop to be set separately and as desired.

Figure 10:
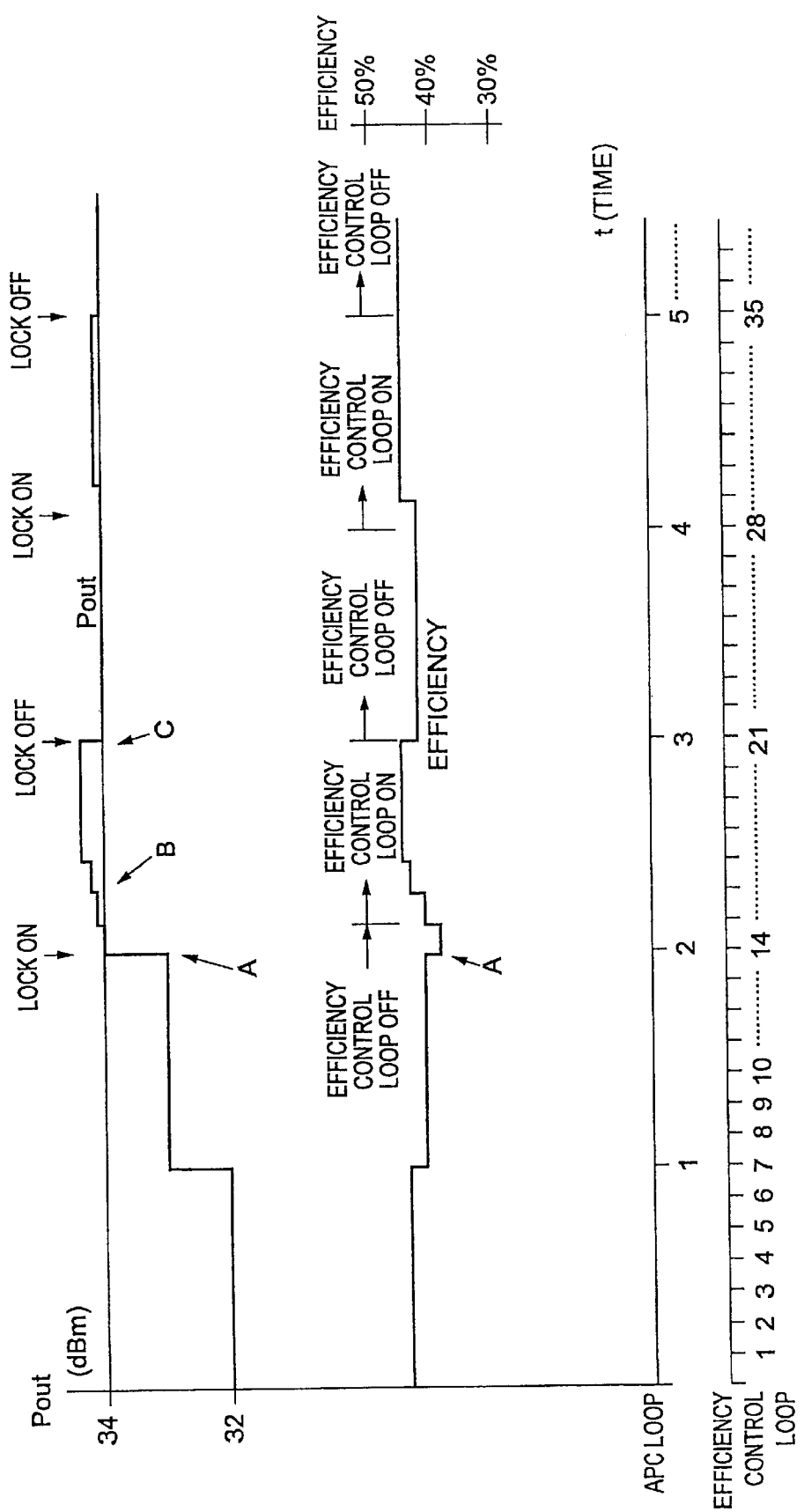
FIG. 10 is a timing chart showing an example of how a bias point which gives the maximum efficiency is converged upon.

FIG. 10 is a timing chart showing an example of how a bias point which gives the maximum efficiency is converged upon in this embodiment. In the example shown in FIG. 10, the set output power level varies from 32 dBm to 34 dBm, and the response speed of the APC loop is lower than that of the efficiency control loop.

As shown in FIG. 10, when the set output power level is changed from 32 dBm to 34 dBm, the APC loop operates to change the output power level of the amplifier 3 to 34 dBm. The efficiency drops along with that. When the output power level of the amplifier 3 becomes 34 dBm, the efficiency control loop begins to work (see A of FIG. 10). Then the efficiency control loop serves to enhance the efficiency. However, the output power level deviates from 34 dBm along with that (see B of FIG. 10). As the action timing of the APC loop is reached, the output power level returns to 34 dBm (see C of FIG. 10). After that, efficiency enhancement by the efficiency control loop and output power control by the APC loop are repeated to settle the output of the amplifier 3 at 34 dBm, where the maximum efficiency is achieved.

As the efficiency control loop in this embodiment thus stops working the moment the APC loop begins to work, the output power level of the amplifier 3 can be brought back to the set level. Therefore, even if the gate voltage is reduced by the efficiency control loop, the output power level is brought back toward the set level the moment the APC loop begins to work. Thus in this embodiment, the response speed of the APC loop and that of the efficiency control loop can be set separately and as desired, and moreover the response speed of the APC loop may be lower than that of the efficiency control loop.

Embodiment 3

Figure 11:
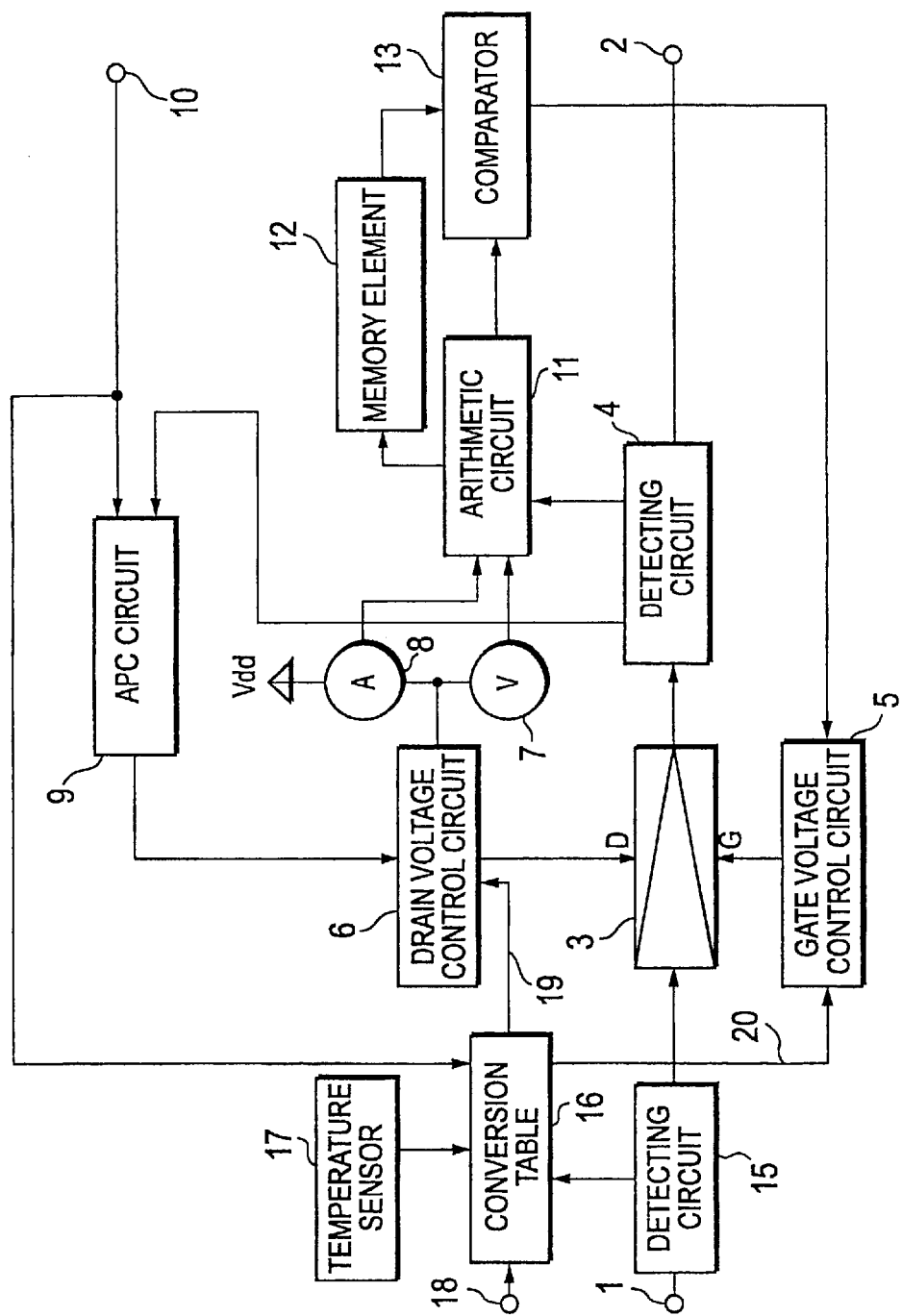
FIG. 11 is a block diagram illustrating a power amplifying circuit which is a third embodiment of the present invention.

FIG. 11 is a block diagram illustrating a power amplifying circuit which is a third embodiment of the present invention. As shown in FIG. 11, in this embodiment, a detecting circuit 15 for input power level detection is inserted on the input side of the amplifier 3. The detecting circuit 15 outputs the input power level to a conversion table 16. A temperature sensor 17 is further provided. To the conversion table 16 are also connected the output of the temperature sensor 17, a channel terminal 18 and the set input terminal 10, so that temperature information from the temperature sensor 17, frequency information from the channel terminal 18 and the set output power level from the set input terminal 10 are also inputted.

The conversion table 16 is connected to the drain voltage control circuit 6 via a drain voltage presetting line 19 and to the gate voltage control circuit 5 via a gate voltage presetting line 20. In the conversion table 16 are set in advance information on the drain voltage-gate voltage combination to maximize the efficiency for different set output power levels, information on the drain voltage-gate voltage combination to maximize the efficiency for different input voltage levels, information on the drain voltage-gate voltage combination to maximize the efficiency for different temperatures, and information on the drain voltage-gate voltage combination to maximize the efficiency for different frequencies. Incidentally in this embodiment, a presetting means is realized by the conversion table 16.

FIG. 12 is a diagram for explaining one example of the conversion table 16. In this example, information on the drain voltage-gate voltage combination to maximize the efficiency for different temperatures (30° C. and 0° C.) and that for different frequencies (880 MHz and 890 MHz) in the range of −10 dBm to 10 dBm are set. This example, however, is merely a simplified one for illustration, and more information is set in actual use as the purpose requires.

Next will be described the operation of this embodiment.

When the set output power level, input power level, temperature or frequency varies, a drain voltage value and a gate voltage value are outputted from the conversion table 16, and set in the drain voltage control circuit 6 and the gate voltage control circuit 5, respectively, via the drain voltage presetting line 19 and the gate voltage presetting line 20. The drain voltage and the gate voltage value outputted from the conversion table 16 are those to maximize the efficiency under the condition which has changed. The drain voltage control circuit 6 and the gate voltage control circuit 5, upon receipt of the drain voltage and the gate voltage values from the conversion table 16, preset voltages respectively matching the input values at the drain terminal and the gate terminal of the amplifier 3. Note that values not listed in the conversion table 16 may be obtained by interpolation.

For example, if the set output power level inputted to the set input terminal 10 has changed, the drain voltage and the gate voltage values to give the maximum efficiency at the changed set output power level are outputted from the conversion table 16. If the input power level from the detecting circuit 15, the detected temperature from the temperature sensor or the frequency information inputted to the channel terminal 18 has changed, the drain voltage and the gate voltage values to give the maximum efficiency under the changed condition are outputted from the conversion table 16.

Therefore, if the set output power level, input power level, temperature or frequency changes, the drain voltage and the gate voltage values to give the maximum efficiency under the changed condition are reset in the amplifier 3. The APC loop and the efficiency control loop operate in the same manner as in the first embodiment.

The drain voltage and the gate voltage preset when the condition changes are set under open loop control. Therefore, the bias point that is preset (the gate voltage and the drain voltage) may be caused by a fluctuation in the amplifier 3 or some other factor to deviate from the bias point that really gives the maximum efficiency. However, afterwards the APC loop and the efficiency control loop will bring the bias point to where the maximum efficiency is provided.

Since in this embodiment the combination of the drain voltage and the gate voltage to give the maximum efficiency when the set output power level, input power level, temperature or frequency changes is preset in the amplifier 3, the time taken by the APC loop and the efficiency control loop for convergence is shortened. Especially when the set output power level, input power level, temperature and/or frequency change greatly, there is an effect to substantially reduce the convergence time taken by the APC loop and the efficiency control loop.

Embodiment 4

In the third embodiment, when the set output power level and/or any other condition changed, the drain voltage and the gate voltage to maximize the efficiency are reset, and after that the APC loop and the efficiency control loop operate in the same manner as in the first embodiment.

Figure 13:
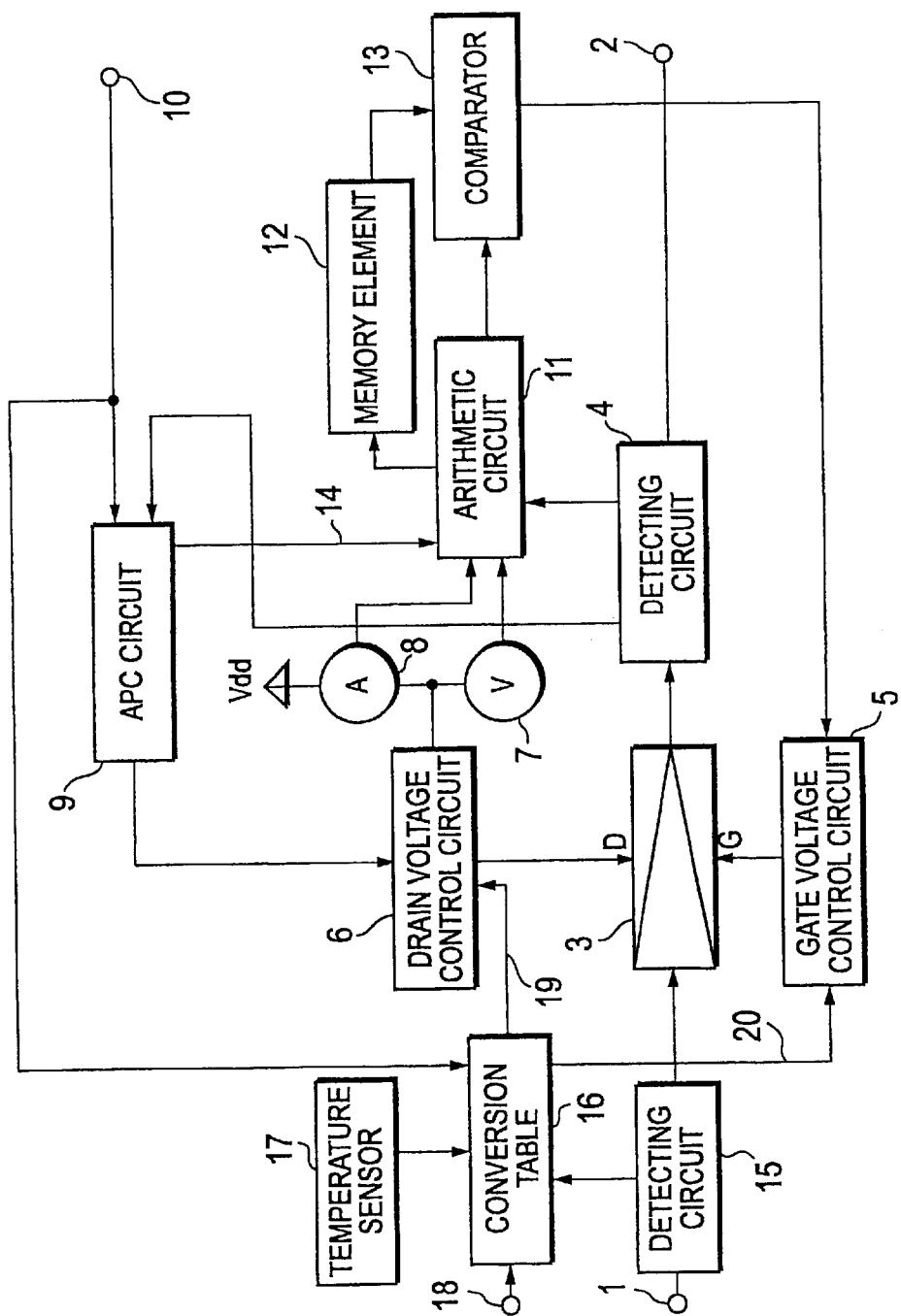
FIG. 13 is a block diagram illustrating a power amplifying circuit which is a fourth embodiment of the present invention.

However, the efficiency control loop, as in the second embodiment, may as well operate only when the APC loop has converged on the set output power level. FIG. 13 is a block diagram illustrating such am embodiment. Therefore, in the configuration shown in FIG. 13, the APC circuit 9 and the arithmetic circuit 11 are connected by the setting level identify signal line 14, and the detecting circuit 15 for input power level detection is inserted on the input side of the amplifier 3. The temperature sensor 17 is further provided. To the conversion table 16 are also inputted temperature information from the temperature sensor 17, frequency information from the channel terminal 18 and the set output power level from the set input terminal 10.

Description of its operation is dispensed with here, because it is the same as in the second or third embodiment.

As described so far, in each of the embodiments cited above, taking note of the fact that the gate bias to give the maximum efficiency is uniquely determined by the power output level, control is effect so that the gate bias automatically converge on the point where the maximum efficiency is achieved. Therefore, if the present invention is applied to amplifiers whose saturation is acceptable (whose gate bias can be set as desired) such as an amplifier in the transmission power control circuit in a radio apparatus using a constant envelope modulation system, such as GMSK, the advantages of the constant envelope modulation system can be further strengthened.

To add, although the amplifier 3 in every one of the aforementioned embodiments consists of a MOSFET, the amplifier 3 may as well consist of a GaAsFET.

Figure 14:
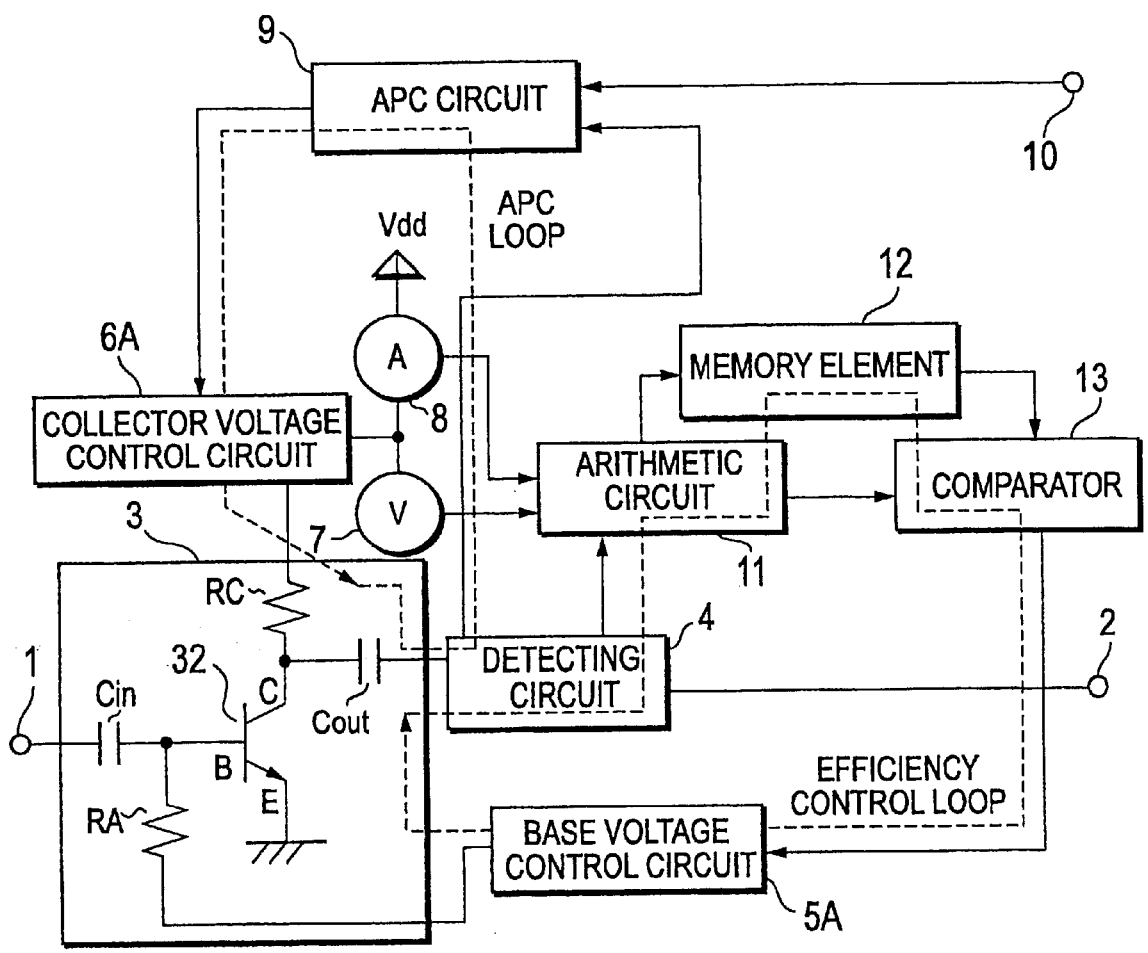
FIG. 14 is a block diagram illustrating an example of the configuration of a power amplifying circuit using a bipolar transistor.
Figure 15:
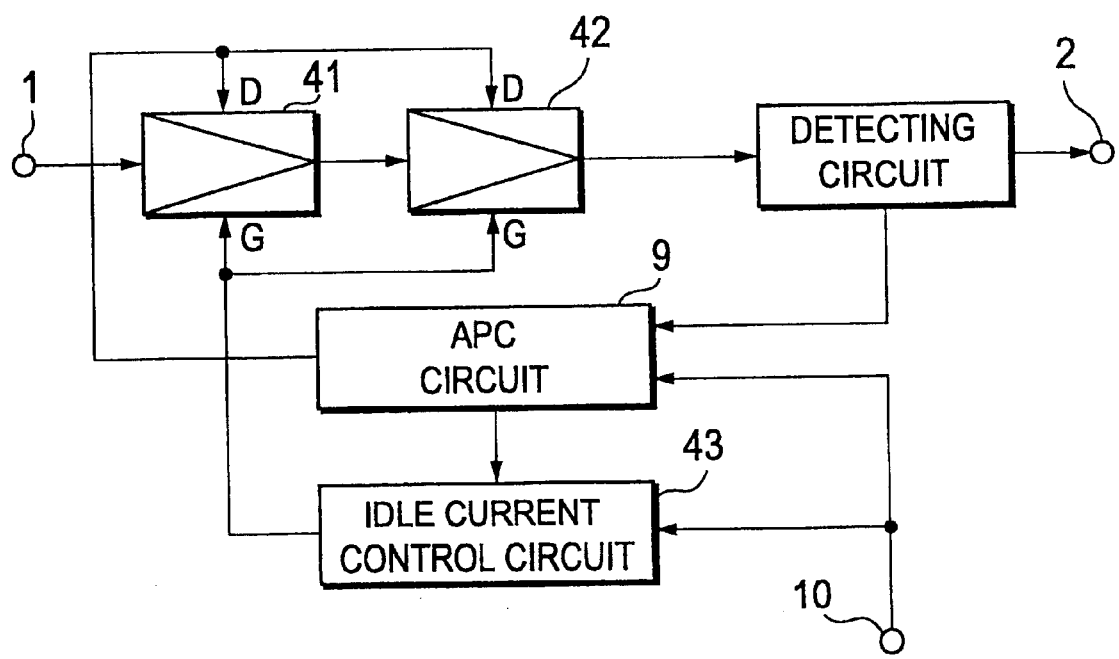
FIG. 15 is a block diagram illustrating a power amplifying circuit according to the prior art.

Alternatively the amplifier 3 may consist of a bipolar transistor. FIG. 14 is a block diagram illustrating an example of the configuration of a power amplifying circuit using a bipolar transistor as the amplifier 3. The example shown in FIG. 14 uses, as the amplifier 3, an NPN transistor 32 to whose base are introduced input signals via a capacitor Cin. To the base of the transistor 32 is applied a base bias voltage RA, controlled by a base voltage control circuit 5A, via a resistor RA. To the collector of the transistor 32 is applied a collector bias voltage, controlled by a collector voltage control circuit 6A, via a resistor RC. The output of the transistor 32 is taken out via the resistor RC and a capacitor Cout.

In the efficiency control loop, the arithmetic circuit 11 and the comparator 13 operate in the same way as in any of the above-described embodiments. The base voltage control circuit 5A operates similarly to the gate voltage control circuit 5 in any of the foregoing embodiments, and provides the transistor 32 with a base bias voltage that maximizes the efficiency. In the APC loop as well, the APC circuit 9 operates in the same way as its counterparts in the foregoing embodiments. The collector voltage control circuit 6A operates similarly to the drain voltage control circuit 6 in any of the foregoing embodiments, and provides the transistor 32 with a collector bias voltage that makes the output power identical with the set level.

As hitherto described, the present invention, according to which the power amplifying circuit has a configuration in which an APC loop is augmented with an efficiency control loop, provides the benefit that the output power level is identical with the set level when the output power level, input power level, temperature or frequency has changed, even if the characteristic of the amplifier fluctuates, the bias voltage accurately and automatically converges on a bias point that provides the maximum efficiency, resulting in a saving in power consumption, and moreover low-cost power amplifier circuits which require no adjustment and permit ready mass production are made available.

The invention, according to which an automatic power control method is so configured that a currently measured efficiency value and an efficiency value measure at the preceding measurement timing are compared and, if the two efficiency values are not identical, the bias value of the amplifier is varied in the direction of enhancing the power efficiency, provides the further benefit that the output power level is identical with the set level when the output power level, input power level, temperature or frequency in the power amplifying circuit has changed, even if the characteristic of the amplifier fluctuates, and the bias voltage accurately and automatically converges on a bias point that provides the maximum efficiency.

What is claimed is:

1. A power amplifying circuit comprising:
   an APC (automatic power control circuit) loop for causing an output power level to comply with a set output power level automatically, and
   an efficiency control loop for detecting power efficiency by calculating the power efficiency based on an input voltage, an input current and the output power level and controlling the bias value of an amplifier arranged in the power amplifying circuit.

2. The power amplifying circuit of claim 1 wherein said efficiency control loop comprises:
   an arithmetic means for calculating the power efficiency of the power amplifying circuit by introducing the input current, the input voltage and the output power level, and a bias control means for controlling the bias value of the amplifier on the basis of an efficiency value outputted from said arithmetic means.

3. The power amplifying circuit of claim 2 wherein said arithmetic means calculates the efficiency value at prescribed intervals of time; and said bias control means compares the efficiency value currently outputted from the arithmetic means and the efficiency value outputted from the arithmetic means last time, and alters the bias value of the amplifier if the two efficiency values are not identical.

4. The power amplifying circuit of claim 3 wherein said bias control means varies the bias value in the same direction in which it was varied at the preceding control timing if the efficiency value currently outputted from the arithmetic means is greater than the preceding efficiency value, or varies the bias value in the direction reverse to that in which it was varied at the preceding control timing if the efficiency value currently outputted from the arithmetic means is smaller than the preceding efficiency value.

5. The power amplifying circuit of claim 1 wherein said amplifier is a FET, said APC loop controls the drain bias value of the FET and said efficiency control loop controls the gate bias value of the FET.

6. The power amplifying circuit of claim 1 wherein said response speed of the APC loop is higher than that of the efficiency control loop.

7. The power amplifying circuit of claim 1 wherein said efficiency control loop effects control when the output power level of the amplifier is identical with the set output power level.

8. The power amplifying circuit of claim 1 further comprising:

a presetting means for storing control setpoints to give the maximum efficiency at different set output power levels and, when the set output power level changes, outputting to the amplifier a control setpoint matching the changed level.

9. The power amplifying circuit of claim 8 further comprising:

an input level detecting means for detecting the input power level of the amplifier, and the presetting means has control setpoints to give the maximum efficiency at different input power levels and, when the input power level changes, outputs a control setpoint matching the changed level to the amplifier.

10. The power amplifying circuit of claim 8 further comprising:

a temperature detecting means for detecting the temperature and the presetting means stores bias value to give the maximum efficiency at different temperatures and, when the temperature changes, outputs to the amplifier a control setpoint matching the changed temperature.

11. The power amplifying circuit of claim 8 wherein said presetting means stores control setpoints to give the maximum efficiency at different frequencies and, when the frequency of signals inputted to the amplifier changes, outputs to the amplifier a control setpoint matching the changed frequency.

12. The power amplifying circuit of claim 1 wherein said amplifier amplifies constant envelope-modulated signals.

13. An automatic power control method comprising the steps of:

detecting the output power level of a power amplifying circuit, controlling an amplifier provided in said power amplifying circuit so as to make the detected output power level identical with a set output power level, measuring the power efficiency by calculating the power efficiency based on an input voltage, an input current, and the output power level of said power amplifying circuit, and controlling the bias value of said amplifier.

14. The automatic power control method of claim 13 further comprising the step of measuring said power efficiency of an amplifier intermittently, comparing each measured efficiency value with the efficiency value measured at the preceding measurement timing, and varying the bias value of the amplifier in the direction of enhancing the power efficiency if the two efficiency values are not identical.

15. The automatic power control method of claim 14 further comprising the step of varying the bias value in the same direction in which it was varied at the preceding measurement timing if the currently measured efficiency value is greater than the preceding efficiency value, and varying the bias value in the direction reverse to that in which it was varied at the preceding measurement timing if the currently measured efficiency value is smaller than the preceding efficiency value.

16. The automatic power control method of claim 13 wherein the objects of power control are said constant envelope-modulated signals.

* * * * *